US008889986B2

(12) United States Patent
Montena (10) Patent No.: US 8,889,986 B2
(45) Date of Patent: Nov. 18, 2014

(54) ELECTRICAL FILTER HOUSING KIT AND METHOD OF MAKING AN ELECTRICAL FILTER

(75) Inventor: Noah P. Montena, Syracuse, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 961 days.

(21) Appl. No.: 12/912,006

(22) Filed: Oct. 26, 2010

(65) Prior Publication Data

US 2012/0097417 A1    Apr. 26, 2012

(51) Int. Cl.
*H01R 13/46*    (2006.01)
*H05K 13/00*    (2006.01)
*H05K 9/00*     (2006.01)
*H03H 1/00*     (2006.01)

(52) U.S. Cl.
CPC .............. *H05K 9/006* (2013.01); *H03H 1/0007* (2013.01)
USPC ............ 174/60; 174/559; 174/74 R; 333/175; 333/185

(58) Field of Classification Search
CPC ... H05K 5/004; H05K 5/0021; H05K 5/0026; H05K 5/0039; H05K 5/0047; H05K 5/006; H05K 5/0052; H05K 5/0069; H01R 13/719; H01R 13/66; H01R 24/00; H01R 24/005; H01R 24/42; H03H 1/0007
USPC .......... 174/60, 59, 559, 74 R, 75 R, 75 C, 76, 174/84 R; 333/175, 185; 439/76.1, 620.03, 439/63, 578, 581; 361/748, 756
See application file for complete search history.

(56) References Cited

U.S. PATENT DOCUMENTS

| | | | |
|---|---|---|---|
| 2,914,740 A | 11/1959 | Blonder | |
| 4,451,803 A | 5/1984 | Holdsworth et al. | |
| 4,701,726 A * | 10/1987 | Holdsworth | .................. 333/185 |
| 5,150,087 A | 9/1992 | Yoshie et al. | |
| 5,278,525 A | 1/1994 | Palinkas | |
| 5,662,489 A | 9/1997 | Stirling | |
| 5,788,535 A | 8/1998 | Stinsky et al. | |
| 6,165,019 A | 12/2000 | Kha et al. | |
| 6,380,826 B1 | 4/2002 | Palinkas | |
| 6,476,688 B2 | 11/2002 | Palinkas | |
| 6,791,436 B2 * | 9/2004 | Zennamo et al. | ............. 333/185 |
| 7,278,887 B1 * | 10/2007 | Palinkas et al. | .......... 439/620.03 |
| 7,303,439 B1 | 12/2007 | Montena | |
| 7,323,951 B2 | 1/2008 | Montena | |
| 2004/0104787 A1 | 6/2004 | Shafer et al. | |
| 2005/0164525 A1 | 7/2005 | Benson et al. | |
| 2007/0013461 A1 | 1/2007 | Montena | |
| 2007/0298661 A1 | 12/2007 | Montena | |

* cited by examiner

*Primary Examiner* — Hoa C Nguyen
*Assistant Examiner* — Amol Patel
(74) *Attorney, Agent, or Firm* — Hiscock & Barclay LLP

(57) ABSTRACT

A filter housing having a first filter housing section extending around a first space with a first central axis, a second filter housing section extending around a second space with a second central axis, and a first coupler. The first and second filter housing sections are combined with the first coupler to produce the filter housing by connecting a first end of the first filter housing section and a first end of the second filter housing section to the first coupler into a first combined configuration to define a combined space to operatively support a printed circuit board extending into and continuously between the first and second spaces through the first coupler. The second end of the first filter housing section is configured to selectively operatively connect to either of a separate: a) end fitting for a cable; and b) a second coupler through which a printed circuit board can be directed.

25 Claims, 8 Drawing Sheets

ELECTRICAL FILTER HOUSING KIT AND METHOD OF MAKING AN ELECTRICAL FILTER

BACKGROUND OF THE INVENTION

1. Field of the Invention

This invention relates to electrical filters and, more particularly, to an electrical filter housing that is defined cooperatively by joined filter housing sections. The invention is also directed to a method of making an electrical filter.

2. Background Art

RF filters are used widely in the cable television (CATV) industry. The filters are commonly constructed using printed circuit boards. Through frequency control, signal propagation through cable lines can be controlled. Signals from different channels can be selectively blocked by the filters so that a subscriber has access to only those channels that he/she has paid for in a particular package.

In a typical electrical filter, a printed circuit board is provided within a cylindrical housing. It is known to form the housing by combining two housing halves, each having a cable end fitting. A split housing construction facilitates the installation of the printed circuit board within a space bounded by the housing parts. With these components assembled, an electrical path is defined between the cable end fittings through the printed circuit board. Access openings are provided through the housing to allow manual electrical adjustments that permit tuning of the electrical filter. The filter construction is completed by fitting a cylindrical sleeve over the combined housing sections.

The length of the printed circuit board is determined by the particular application. Ideally, to avoid excessive component size and material waste, the filter housings are nominally matched in axial extent to the length of the printed circuit board to be contained therewithin. That is, the internal space bounded by the housing part(s) has an axial extent that will accommodate the printed circuit board while allowing an optimal spacing at the ends to facilitate electrical connection to the cable end fittings.

The need to match the dimensions of the housing and printed circuit board potentially introduces a number of inefficiencies, both from the standpoint of inventory control and manufacturing. An excess supply of a particular printed circuit board necessitates a corresponding excess supply of matched housings.

Additionally, the need to match printed circuit boards with particular housings may result in separately dedicated stations or lines to produce each, of the potentially multiple, different electrical filter designs.

Businesses that make and supply cable components are constantly striving to increase efficiencies. Heretofore, the industry has contended with the above-mentioned problems primarily because there has not been a viable design that adequately addresses these problems.

SUMMARY OF THE INVENTION

In one form of the invention, an electrical filter housing kit is provided. The kit includes a first group of components made up of a first filter housing section extending around a first space with a first central axis and having axially spaced first and second ends, a second filter housing section extending around a second space with a second central axis and having axially spaced first and second ends, a first coupler, a first cable end fitting, and a second cable end fitting. The first group of components can be combined to selectively define filter housings having different axial lengths including one combined configuration with: i) the first axial end of the first filter housing section and the first axial end of the second filter housing section connected to the first coupler to define a combined space for a printed circuit board between the second axial ends of the first and second housing sections within which a printer circuit board can be operatively supported to extend into and continuously between the first and second spaces through the first coupler; and ii) the first and second cable end fittings connected one each to the second axial ends of the filter housing sections.

In one form, the first coupler has an edge to cooperate with a printed circuit board to maintain a printed circuit board in a predetermined orientation in the combined space with the first group of components in the one combined configuration.

In one form, the edge bounds a slot through which an edge of a printed circuit board within the combined space can be axially guided.

In one form, the first filter housing section has at least one edge to cooperate with a printed circuit board to maintain the printed circuit board in a predetermined orientation in the combined space with the first group of components in the one combined configuration.

In one form, the at least one edge is made up of first and second pairs of edges between which separate slots are formed at diametrically opposite locations on the first filter housing section.

In one form, the first ends of the first and second filter housing sections are each telescopingly engaged with the first coupler with the first group of components in the one combined configuration.

In one form, there are cooperating keying components, at least one each on the first axial end of the first filter housing section and the first coupler, that limit relative angular movement between the first filter housing section and first coupler.

In one form, the first coupler and first filter housing section each has a cylindrical wall and the keying component on one of the first coupler and first filter housing section is struck from the cylindrical wall on the one of the first coupler and the first filter housing section.

In one form, the first cable end fitting and first coupler are each telescopingly engageable with each of the second axial end of the first filter housing section and the first axial end of the second filter section housing.

In one form, there are cooperating keying components on the first cable end fitting and first filter housing section that interact to key the first cable end fitting and first filter housing section so as to limit relative angular movement therebetween with the first filter housing section and first cable end fitting in at least first and second different relative angular positions.

In one form the kit further includes first and second sleeves with different axial lengths that are usable to selectively closely respectively surround the first group of components in the one combined configuration and the another combined configuration.

In one form the kit further includes first and second printed circuit boards with different lengths that can be respectively operatively connected between the first and second cable end fittings with the first group of components in the one combined configuration and the another combined configuration.

In one form the kit further includes a third filter housing section extending around a third space with a third central axis and having axially spaced first and second ends, and a second coupler. The first group of components and third filter housing section and second coupler are combinable to define a filter housing with a further combined configuration with the first and second filter housing sections and first coupler in the one combined configuration and the second coupler connected to the second end of the first filter housing section and the first axial end of the third filter housing section and the first cable end fitting connected to the second axial end of the third filter housing section.

In one form, the first and second filter housing sections in the first combined configuration and the first and second cable fittings are all separate components in a set that are each aligned with and axially movable relative to at least one adjacent component in the set to operatively connect the components in the set.

In one form, the first group of components is combinable to define a filter housing with another combined configuration with the first and second cable end fittings connected one each to the first and second axial ends of one of the first and second filter housing sections wherein a space for a printed circuit board is defined between the first and second ends of the one of the first and second filter housing sections.

In another form, the invention is directed to a filter housing having a first filter housing section that extends around a first space with a first central axis and has axially spaced first and second ends, a second filter housing section that extends around a second space with a second central axis and has axially spaced first and second ends, and a first coupler. The first and second filter housing sections are formed separately from each other and the first coupler and are combined with the first coupler to produce the filter housing by connecting each of the first end of the first filter housing section and the first end of the second filter housing section to the first coupler into a first combined configuration. The first and second filter housing sections and first coupler define a combined space to operatively support a printed circuit board extending into and continuously between the first and second spaces through the first coupler. The second end of the first filter housing section is configured to selectively operatively connect to either of a separate: a) end fitting for connection to a cable; and b) second coupler through which a printed circuit board can be directed from the second space.

In one form, the first coupler is telescopingly engaged with each of the first end of the first filter housing section and the first end of the second filter housing section in the first combined configuration.

In one form, the filter housing is provided in combination with a printed circuit board operatively supported within the combined space and first and second cable end fittings connected respectively one each to the second ends of the first and second filter housing sections and connected to the printed circuit board to establish an electrical path between the first and second cable end fittings.

In yet another form of the invention, an electrical filter housing kit has a first group of components. The first group of components is made up of: a first filter housing section that extends around a first space with a first central axis and has axially spaced first and second ends; a second filter housing section that extends around a second space with a second central axis and has axially spaced first and second ends; a first coupler; a first cable end fitting; a second cable end fitting; and structure that cooperates between the first and second filter housing sections, the first coupler, and the first and second cable end fittings to allow the first group of components to be combined to selectively define either a filter housing with: a) one combined configuration with: i) the first end of the first filter housing section and the first end of the second filter housing section connected to the first coupler to define a combined space for a printed circuit board between the second axial ends of the first and second housing sections within which a printed circuit board can be operatively supported to extend into and continuously between the first and second spaces through the first coupler; and ii) the first and second cable end fittings connected one each to the second axial ends of the filter housing sections; or b) another combined configuration with the first and second cable end fittings connected one each to the first and second axial ends of one of the first and second filter housing sections wherein a space for a printed circuit board is defined between the first and second ends of the one of the first and second filter housing sections.

The invention is further directed to a method of forming an electrical filter. The method includes the steps of: providing: a) multiple filter housing sections each extending around a space with a central axis to accept a printed circuit board and having an axial length between first and second ends to which cable end fittings can be respectively connected; b) at least one coupler; and c) first and second cable end fittings; selecting a printed circuit board with a length to be incorporated into the electrical filter; based upon the length of the selected circuit board, selecting multiple filter housing sections that have a combined axial length that is matched to the length of the selected printed circuit board; connecting the selected multiple filter housing sections together through the at least one coupler to define a combined housing configuration with spaced axial ends and a combined space within which the selected printed circuit is operatively supported to extend into and continuously between multiple spaces around which the selected multiple connected filter housings extend, through the at least one coupler; and connecting the first and second cable end fittings, one each at the spaced axial ends of the combined housing configuration, and to the selected printed circuit board to establish an electrical path between the first and second cable end fittings.

In one form, the step of connecting multiple filter housing sections together involves press-fitting the selected multiple filter housing sections and coupler together by relative axial movement therebetween to establish a keyed connection wherein at least first and second filter housing sections in the selected multiple filter housing sections are each limited in angular movement relative to at least one of the couplers to which the first and second filter housing sections are connected.

DETAILED DESCRIPTION OF THE PREFERRED EMBODIMENT

Figure 1:
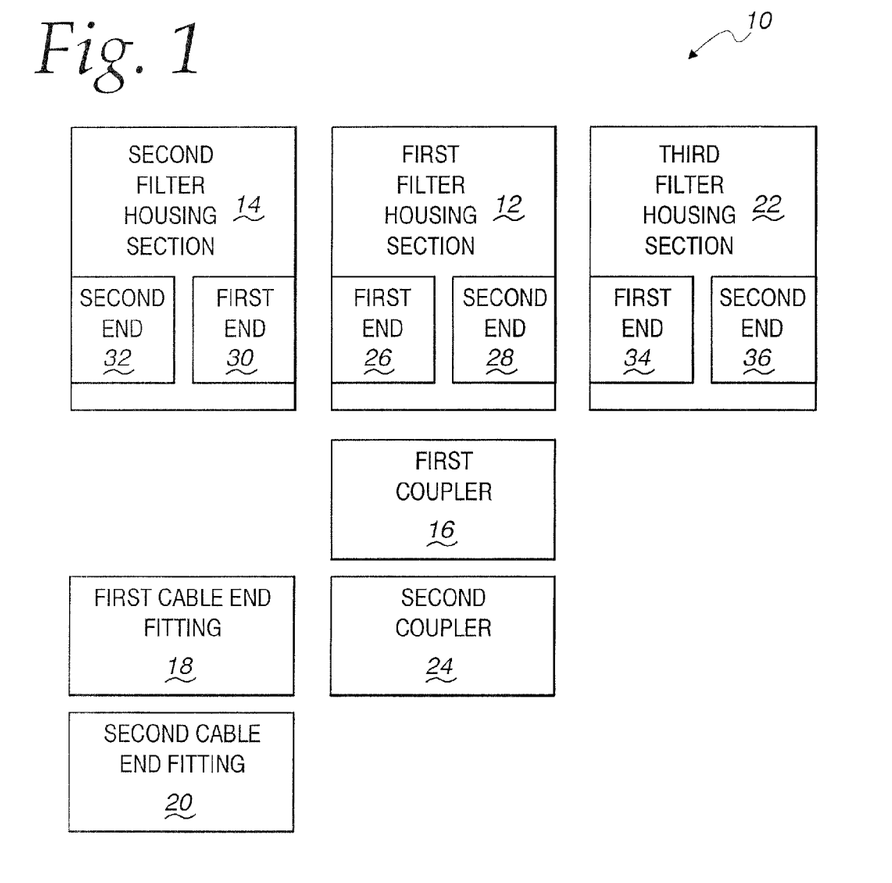
FIG. 1 is a schematic representation of a kit with components from which different filter housing configurations can be constructed and consisting of filter housing sections, couplers, and cable end fittings.

In one form of the invention, a kit is provided as shown at 10 in schematic form in FIG. 1. The kit 10 consists of a number of components, with a minimum number thereof, defining a first group, made up of a first filter housing section 12, a second filter housing section 14, a first coupler 16, and first and second cable end fittings 18, 20, respectively. The kit 10 can be made from any additional number of components and, as depicted in FIG. 1, includes a third filter housing section 22 and a second coupler 24.

The first filter housing section 12 has spaced first and second ends 26, 28, respectively. The second filter housing section 14 has spaced first and second ends 30, 32, respectively. Each of the filter housing sections 12, 14 extends around a space.

With the first group of components, there are potentially three primary combined configurations that can be produced. In one combined configuration, the first end 26 of the first filter housing section 12 and the first end 30 of the second filter housing section 14 are connected to the first coupler 16 to define a combined space for a printed circuit board (not shown in FIG. 1) between the second ends 28, 32 of the housing sections 12, 14. The printed circuit board can be operatively supported to extend into and continuously between the first and second spaces through the first coupler 16. In this one combined configuration, the first and second cable end fittings 18, 20 are connected one each to the second ends 28, 32 of the filter housing sections 12, 14.

In another combined configuration, the first and second cable end fittings 18, 20 are connected one each to the first and second ends 26, 28 of the first filter housing section 12.

In a third combined configuration, the first and second cable end fittings 18, 20 are connected one each to the first and second ends 30, 32 of the second filter housing section 14.

Each of the filter housing sections 12, 14, 22 has a length. The lengths of the first and second filter housing sections 12, 14 may be the same or different. By making the lengths different, the filter housing sections 12, 14 can be combined with each other, and with other filter housing sections, such as at least the third filter housing section 22, to produce a wide range of different housing lengths.

To combine the third filter housing section 22 to the components in the one combined configuration, a first end 34 of the third filter housing section 22 is connected to the second coupler 24, which in turn is connected to the second end 28 of the first filter housing section 12. One of the first and second end fittings 18,20 is then connected to a second end 36 of the third filter housing section 22 to complete the assembly.

The components in FIG. 1 are shown in schematic form to encompass virtually a limitless number of different variations thereof within the scope of the invention. The components in FIG. 1 are not limited to any specific shape, material, construction, etc.

Figure 2:
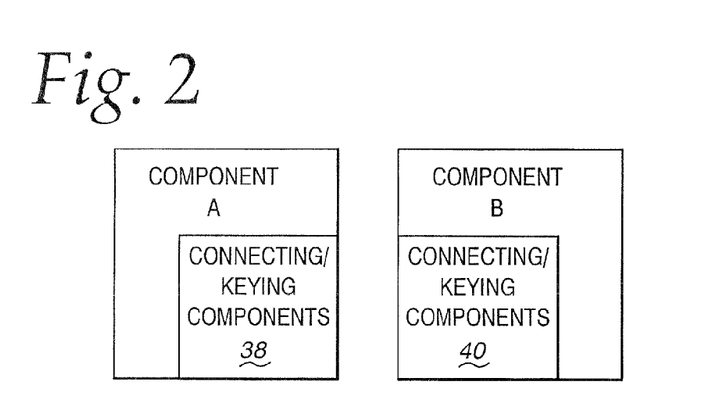
FIG. 2 is a schematic representation of connecting/keying components that cooperate between components shown in FIG. 1.

Further, as shown in FIG. 2, the invention is not limited to any specific structure or manner of connecting any two of the components in FIG. 1, identified generically as components A and B in FIG. 2. In FIG. 2, there are shown connecting components 38, 40, respectively on the components A and B, that allow at least interconnection of the components A and B and potentially keying of the same to each other against certain relative movement. Specific forms of the connecting and keying components 38, 40 are described hereinbelow.

With the inventive concept, modular construction of a filter housing is permitted that allows the housing length to be matched, as at assembly locations, to different printed circuit boards. This can be accomplished by strategically combining housing sections of different length or by combining several relatively short sections having the same length to cumulatively produce a required length to define a space with an axial extent matched to the length of a printed circuit board to be operatively supported for electrical connection to the cable end fittings 18, 20. This permits filters to be made with housing lengths that are as short as possible for a given printed circuit board length. This is desirable from the standpoint of minimizing component size and avoiding material waste.

One exemplary form of the first group of components shown in FIGS. 1 and 2 is depicted in FIGS. 3-6. In these Figs., an exemplary, specific form of the first group of components, identified in FIG. 1, is shown to be combined to produce the one combined configuration, discussed above. As noted, the first group of components consists of the first filter housing section 12 and the second filter housing section 14 that are connected to each other through the first coupler 16.

Figures 3, 4:
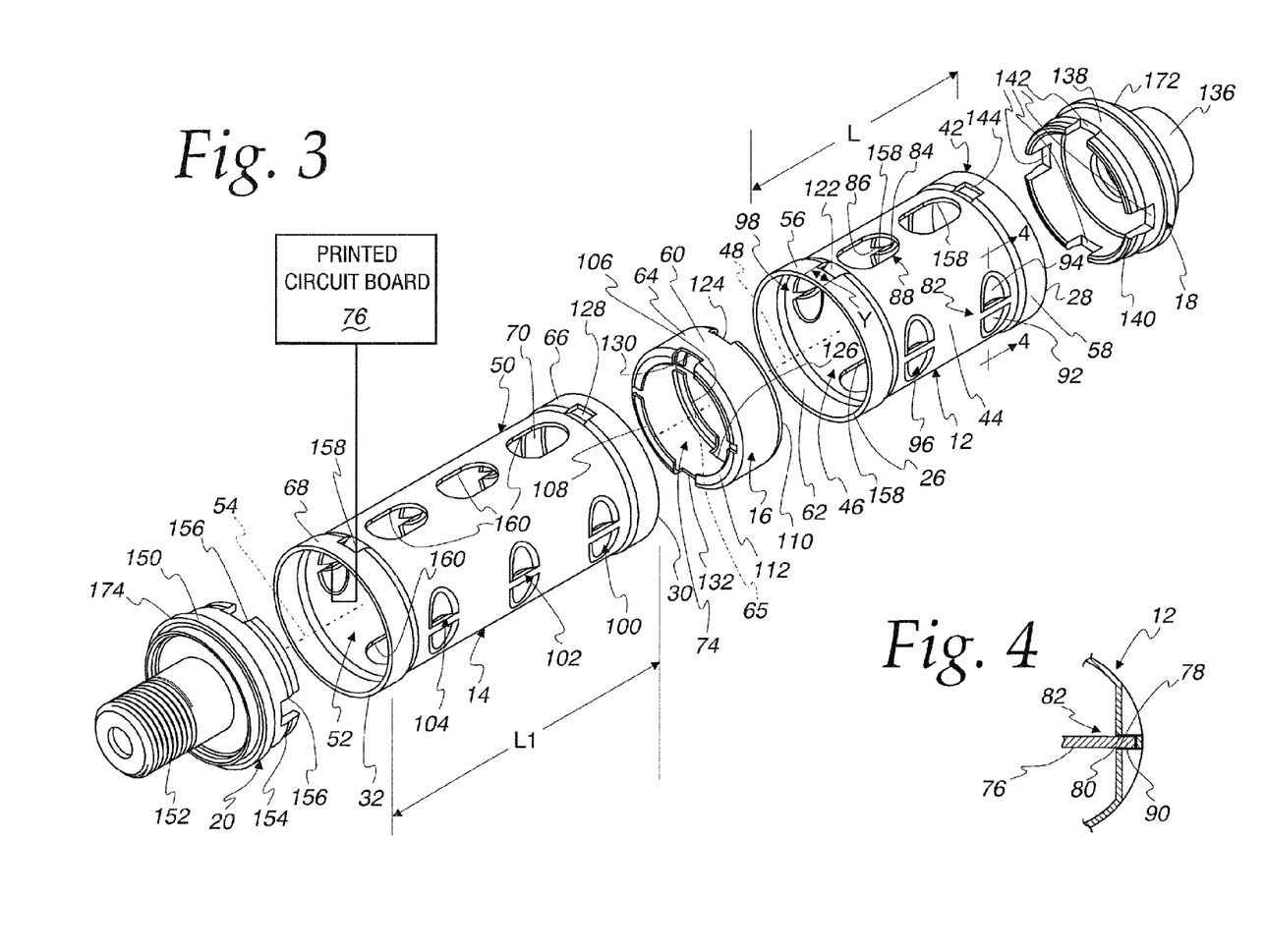
FIG. 3 is an exploded, perspective view of one form of filter housing made with a first selected group of the components shown in FIGS. 1 and 2.
FIG. 4 is a fragmentary, cross-sectional view of edges on one of the filter housing sections that support and align an edge of a printed circuit board within the filter housing.

The first filter housing section 12 has a body 42 with a cylindrical wall 44 that extends around a first space 46. The first filter housing section 12 has a central axis 48 and a length L between the first and second ends 26, 28 that are axially spaced from each other.

The second filter housing section 14 is constructed similarly to the first filter housing section 12 and has a cylindrical body 50 extending around a second space 52. The second filter housing section 14 has a central axis 54, with the first and second ends 30, 32 spaced from each other along the axis 54 by a distance L1. In the depicted embodiment, the length L1 is greater than the length L. However, as noted above, these lengths may be the same.

The body 42 on the first filter housing section 12 has radially enlarged, annular rims 56,58 at the ends 26, 28, respectively. The rims 56, 58 have the same construction.

To connect the first filter housing section 12 and first coupler 16, the first axial end 26 is telescopingly engaged with a cylindrical wall 60 on the coupler 16. In this embodiment, a radially inwardly facing surface 62 on the rim 56 closely surrounds an outer surface 64 on the coupler 16, that extends around a central axis 65.

The second filter housing section 14 has radially enlarged rims 66, 68 at its first and second axial ends 30, 32, respectively, that have the same configuration and dimensions as the rims 56, 58. The first end 30 of the second filter housing section 14 is similarly telescopingly engaged with the first coupler 16 by sliding a radially inwardly facing surface 70 on the rim 66 over the outer surface 64 of the coupler wall 60. The ends 26,30 on the filter housing sections 12, 14, respectively, abut with those components assembled to the coupler 16, as seen most clearly in FIG. 5.

With the first and second filter housing sections 12, 14 and first coupler 16 connected, these components define a combined space 74 for a printed circuit board 76 between the axial ends 28, 32 of the first and second filter housing sections 12, 14. The components are designed to operatively support the printed circuit board 76 in a manner where the printed circuit board 76 extends into, and continuously between, the first and second spaces 46, 52 through the coupler 16.

The first and second filter housing sections 12, 14 and coupler 16 are configured to support the printed circuit board 76 within the combined space 74 in a predetermined angular orientation relative to the axes 48, 54, 65 that are, in this embodiment, coincident. To accomplish this, a series of supporting edges for the circuit board 76 is formed within the combined space 74 on each of the first and second filter housing sections 12, 14 and coupler 16.

On the first filter housing section 12, a first pair of circumferentially spaced edges 78, 80 is defined at a first location 82, with a second, like pair of edges, 84, 86 defined at a diametrically opposite location 88. The edges 78, 80 at the location 82 cooperatively define a guide slot/receptacle for an edge 90 of the printed circuit board 76 that can be slid guidingly therebetween in an axial direction to be situated in a predetermined angular orientation with respect to the axes 48, 54, 65 at an operative axial location, wherein the ends of the printed circuit board 76 can be electrically connected, one each, to the cable end fittings 18, 20. The edge pair 84, 86 at the location 88 cooperates with the opposite edge (not shown) of the printed circuit board 76 in the same manner. The edge pairs 78, 80 and 84, 86 cooperate to positively guide the printed circuit board 76 during assembly and stably support the printed circuit board 76 in its operative position in the predetermined orientation.

The edges 78, 80 are formed by striking portions 92, 94 of the cylindrical wall 44 radially inwardly. The edges 84, 86 are formed in the same manner at the diametrically opposite location 88. The cylindrical wall 44 is similarly radially struck at diametrically opposite locations 96, 98 to produce a like arrangement of diametrically opposite edge pairs, all of which align to cooperatively define a complementary slot/receptacle for the printed circuit board 76.

The cylindrical wall 50 on the second filter housing section 14 is similarly struck radially at three axially spaced locations 100, 102, 104 to produce identical diametrically opposite edge pairs (not labeled) at each such axial location 100, 102, 104, so that the edges (not labeled) on the second filter housing section 14 collectively define a complementary slot/receptacle for the printed circuit board 76.

Figure 6:
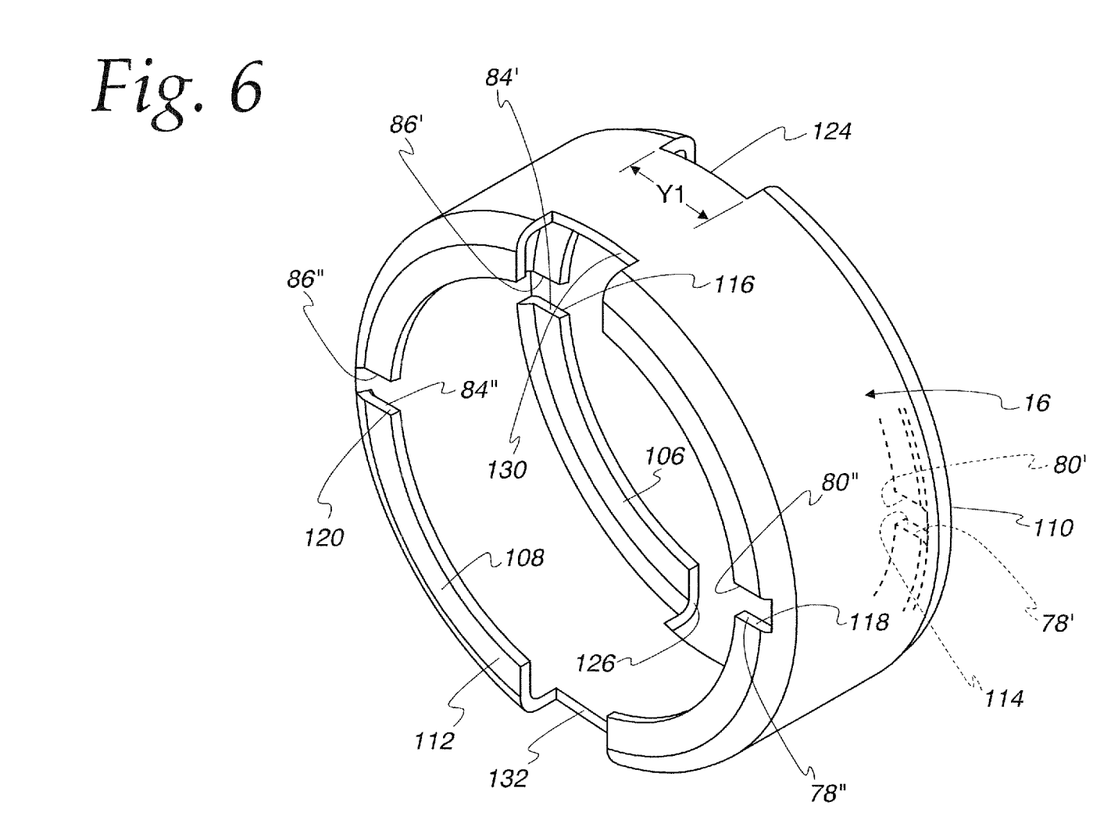
FIG. 6 is an enlarged, perspective view of the coupler between filter housing sections shown in FIGS. 3, 5 and 6.

The coupler 16 has radially inturned walls 106, 108, respectively at the axial ends 110, 112 thereof. The wall 106 has diametrically opposite slots/notches 114, 116 formed therein, with the wall 108 having like, diametrically opposite, slots/notches 118, 120. The slots/notches 114, 116, 118, 120 are respectively bounded by edges 78', 80'; 84', 86'; 78'', 80''; 84'', 86'' corresponding to, and alignable with, the edges of like number on the first filter housing section 12, but without a "'" or "''" designation. The printed circuit board 76 is allowed to be axially slid through the coupler 16, with the first edge 90 thereof moving guidingly through the slots/notches 114, 118, and the opposite edge (not shown) moving guidingly through the notches 116, 120.

The first and second filter housing sections 12, 14, and coupler 16 are assembled so that a continuous slot/receptacle is defined within which the printed circuit board 76 is held in a captive manner between the axial ends 28, 32 by the struck edges (numbered 78, 80, 84, 86 at only one axial location) on the first and second filter housing sections 12, 14 and those 78', 80'; 84', 86'; 78'', 80''; 84'', 86'' on the coupler 16. To accomplish this, the first and second filter housing sections 12, 14 and coupler 16 must be connected in a predetermined angular orientation, which is facilitated by providing the aforementioned keying components/elements between the coupler 16 and each of the first and second filter housing sections 12, 14, as shown generically in FIG. 2.

Figure 5:
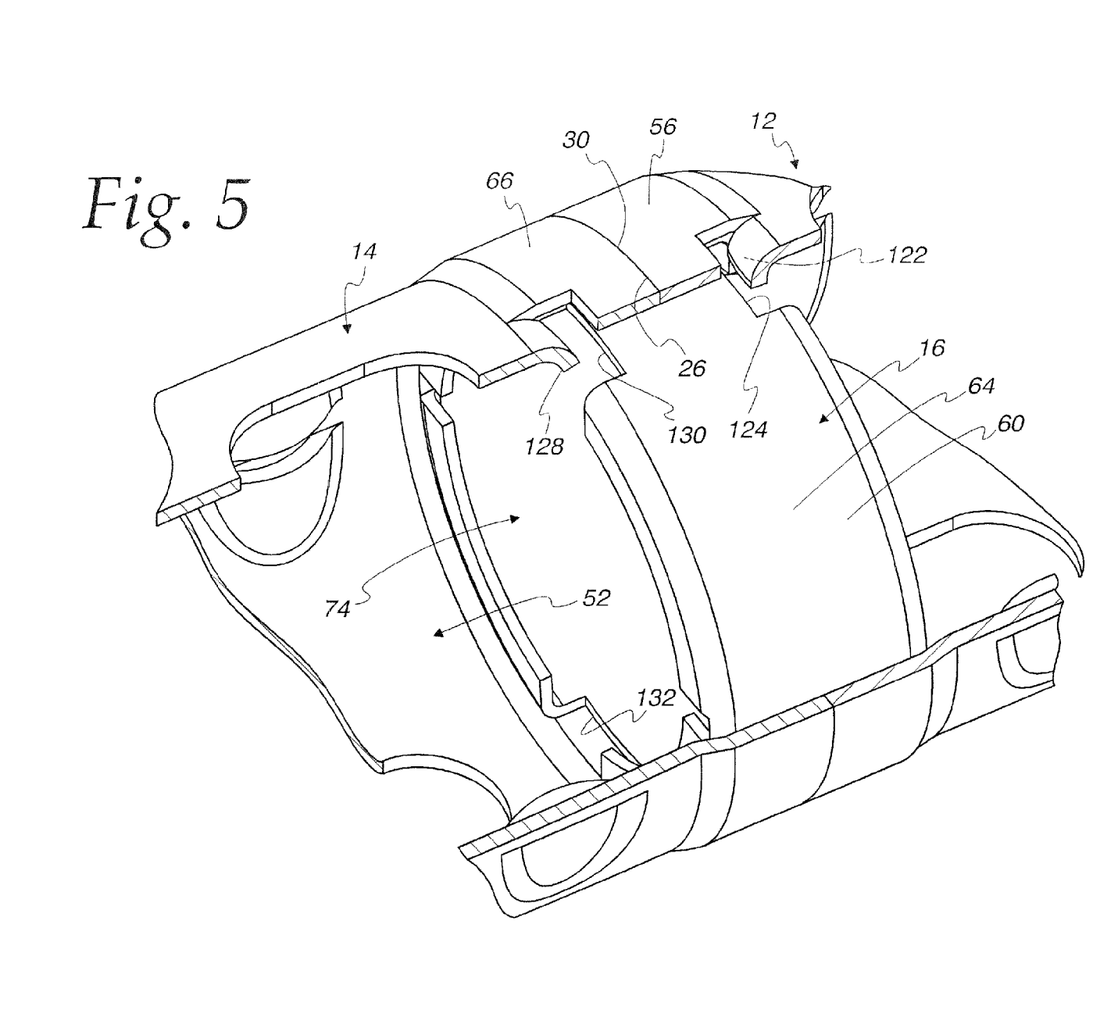
FIG. 5 is an enlarged, fragmentary, perspective view of a location on the filter housing whereat adjacent filter housing sections are connected to the coupler and with portions of the filter housing sections broken away.

The keying element at the axial end 26 of the first filter housing section 12 consists of a finger 122 that is struck radially inwardly from the body 42. The end 110 of the component 16 has a keying element/notch 124 therein that accepts the finger 122 with the first filter housing section 12 and component 16 telescoped into axially overlapping relationship. The finger 122 has a circumferential dimension Y that is nominally matched to the circumferential dimension Y1 of the notch 124. During assembly, a user can axially overlap the end 26 with the coupler 16 and relatively turn these components until he/she can feel the finger 122 register at the notch 124, whereupon further axial movement of these components towards each other fully seats the finger 122 in the notch 124.

An optional, second notch 126 is provided in the coupler 16 at a location diametrically opposite to the notch 124. With this arrangement, the coupler 16 and first filter housing section 112 can be matched in two different relative angular orientations, each of which aligns the notches 114, 116, 118, 120 to accept the printed circuit board 76 in the same angular orientation relative to the joined filter housing section 12.

The second filter housing section 14 has a like keying element/finger 128 that cooperates with like keying elements/notches 130, 132 at the coupler end 112.

Significantly, it should be noted that each of the first and second filter housing sections 112, 114 and coupler 16 is configured to function identically in a reversed axial orientation. Thus, an assembler does not have to maintain a distinction between the axial ends of these components in aligning them for assembly. Rather, the set of selected filter housing sections 12, 14 and coupler 16 need only be concentrically aligned in spaced relationship and thereafter moved axially towards each other to effect a telescoping connection therebetween, wherein the ends of the joined components reside in a relationship wherein one closely surrounds the other. By relatively turning the coupler 16 and first and second filter housing sections 12, 14, the keyed connection can be established to properly angularly orient all three components. By reason of providing circumferentially spaced pairs of notches 124, 126; 130, 132, relative turning to effect this registration will not be required through more than 180°.

The first cable end fitting 18 has an internally threaded end 136 to accommodate a male connector (not shown) on a cable. The end fitting 18 has a body 138 with an axial end rim 140 that can be telescopingly engaged with the rim 58 on the first filter housing section 12. The rim 140 has a series of notches 142 disposed at regular intervals circumferentially therearound to accommodate a struck finger 144 at the end 28, that is included to make the first filter housing section 12 axially reversible. Additionally, this keyed connection prevents turning of the end fitting 18 relative to the filter housing section 12 under a turning force applied to thread an end connector on a cable into the end fitting 18. Multiple notches 142 are provided to limit the maximum relative angular movement between the end fitting 18 and first filter housing section 12 required to register the finger 144 with one of the notches 142.

The second cable end fitting 20 has a body 150 with a threaded male end 152 for accepting an internally threaded connector (not shown) on a cable end. The end fitting 20 has a rim 154, configured the same as the rim 140, to be telescopingly engaged with the rim 68 on the second filter housing section 14. Notches 156 accommodate a finger 157 that is provided on the second filter housing section 14 to make the same axially reversible. This keyed arrangement also prevents turning of the end fitting 20 relative to the housing section 14 under a torque applied to thread a cable end connector to the end 152.

The first filter housing section 12 has a series of elongate openings 158 at axially spaced and diametrically opposite locations through the wall 44, to gain access to the installed printed circuit board 76, to allow a tuning operation to be performed thereon. Like openings 160 are provided in the second filter housing section 14. The multiple openings 158, 160 are provided to tune components on virtually all anticipated configurations for the printed circuit board 76.

Figure 7:
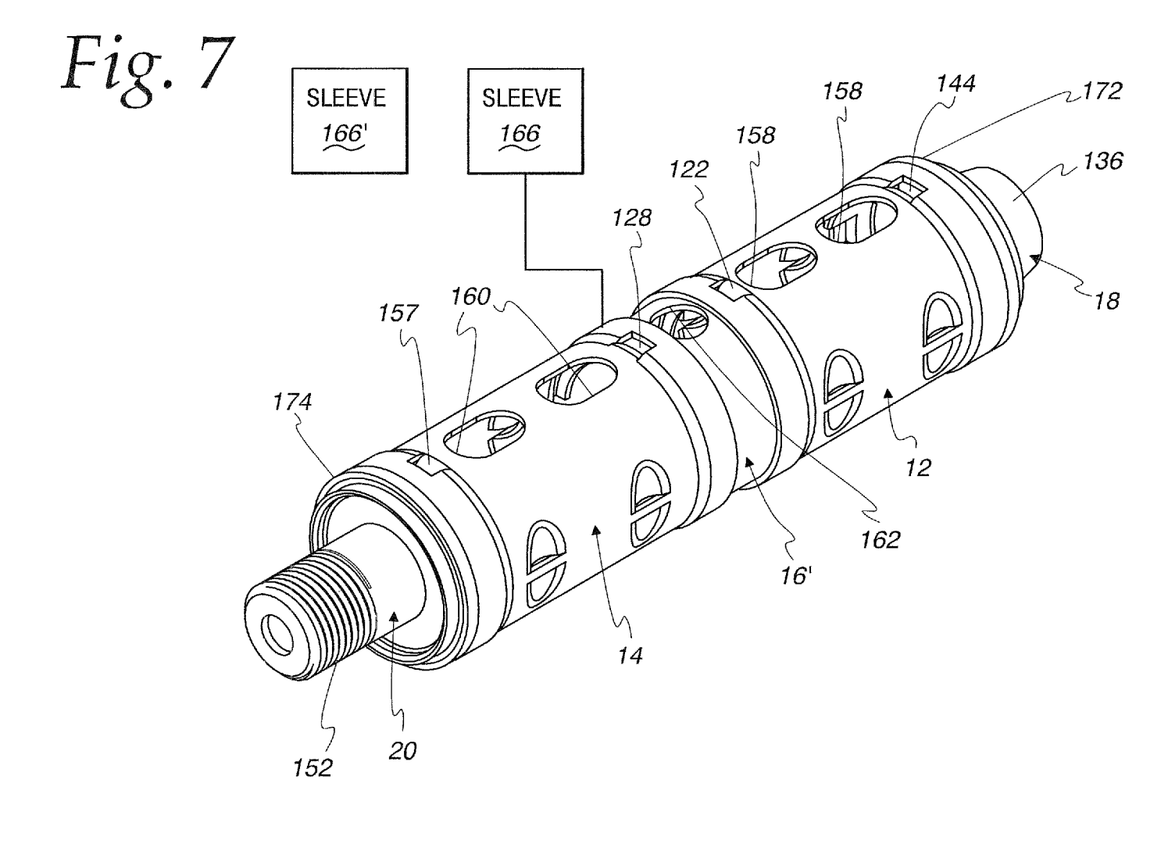
FIG. 7 is a perspective view of the filter housing in FIG. 3 in an assembled state but with a modified form of coupler.
Figure 8:
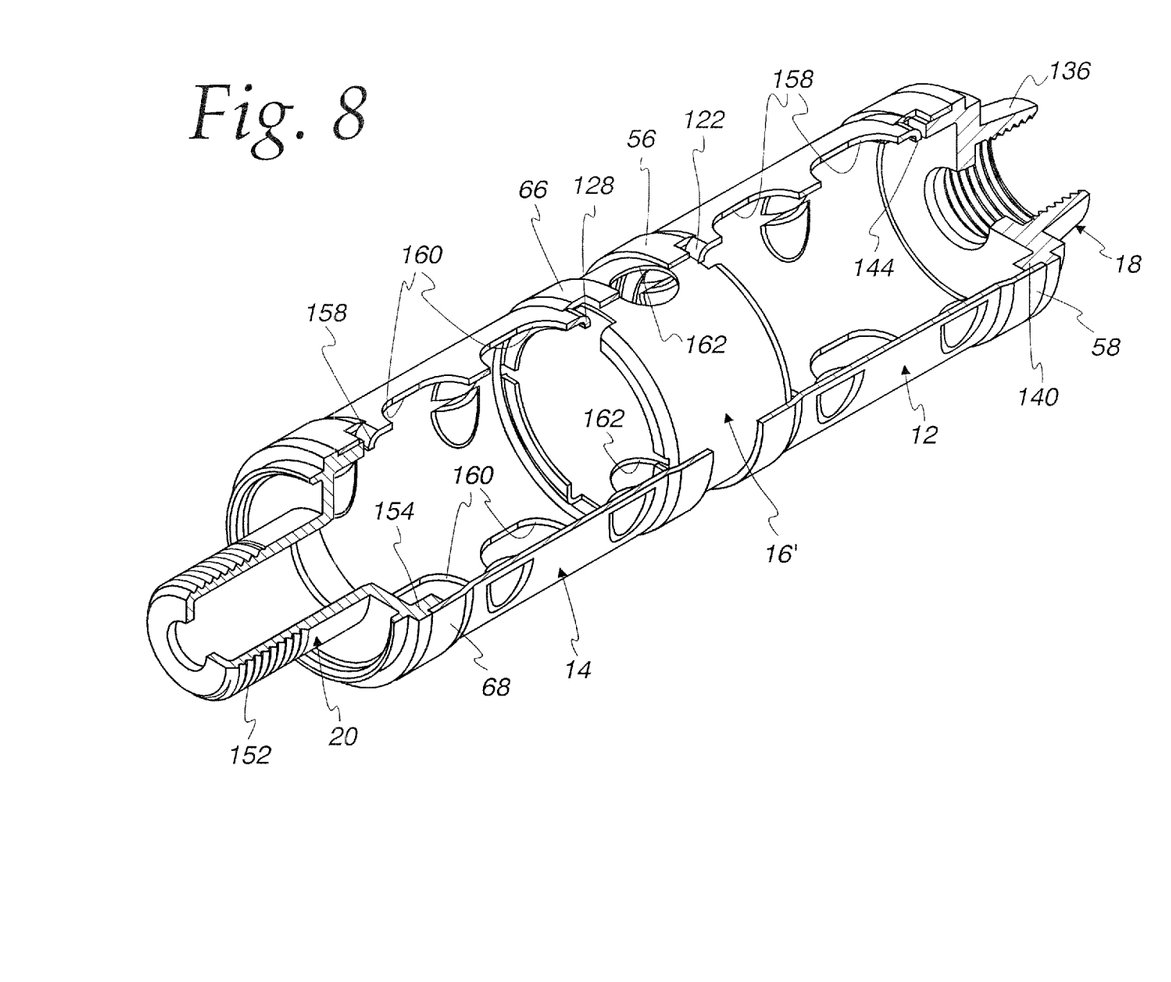
FIG. 8 is a view as in FIG. 7 wherein portions of filter housing sections are broken away.
Figure 9:
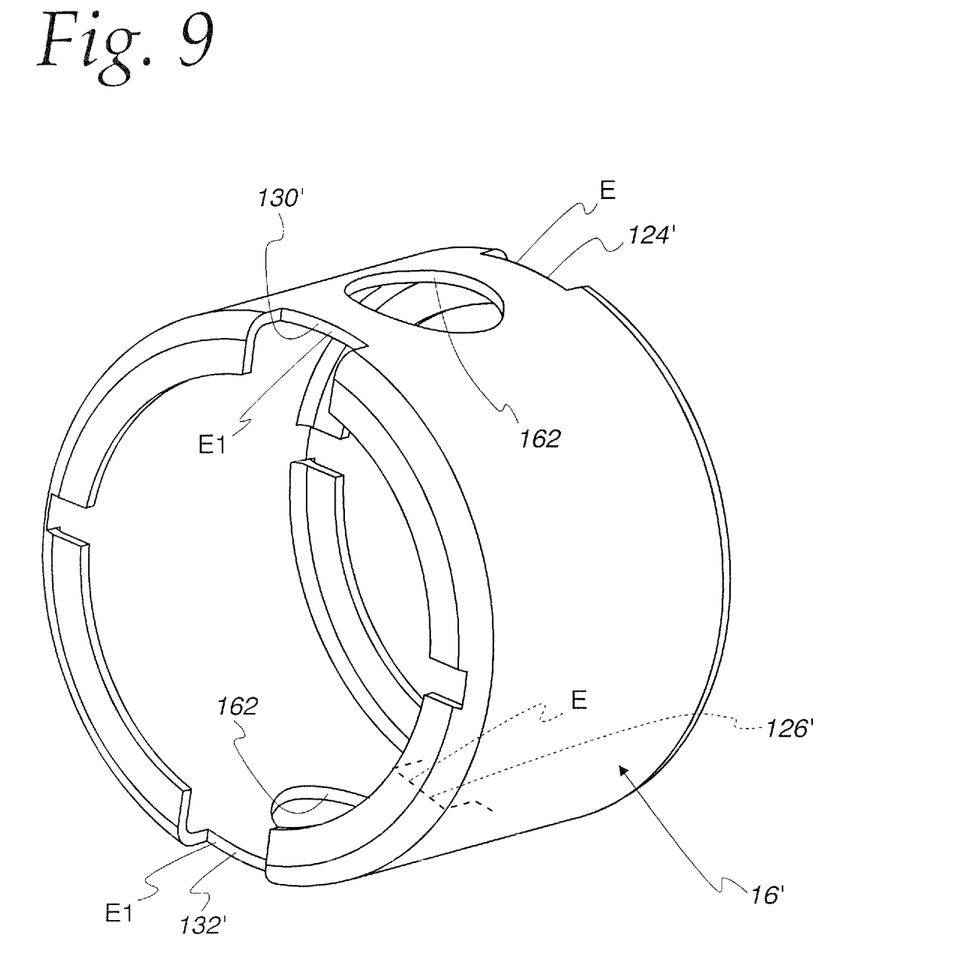
FIG. 9 is a view as in FIG. 6 of the coupler in FIGS. 7 and 8.

Optional access openings 162 may be provided on a modified coupler 16', as shown in FIGS. 7-9. The coupler 16' has the same configuration as the coupler 16 with the exception that the coupler 16' has a greater axial dimension to allow for placement of the openings 162 and to allow the openings to remain exposed with the coupler 16 connected to the filter housing sections 12, 14, as seen in FIGS. 7 and 8. To consistently maintain the depicted axial alignment of these components, the fingers 122, 128 on the filter housing sections 12, 14 are configured to abut to the edges E, E1 at the bases of the notches 124', 126'; 130', 132', respectively.

With the components in the first group assembled as shown in FIGS. 7 and 8, and with the coupler 16' substituted for the coupler 16, a conventional sleeve 166 is disposed thereover and suitably secured thereto to maintain these components positively in the assembled relationship shown in FIGS. 7 and 8. The sleeve 166 also blocks the openings 158, 160, 162 to prevent tampering by an end user with the components on the printed circuit board 76. In one form, the sleeve 166 may be crimped over the annular edges 172, 174 of the cable end fittings 18, 20, respectively, to produce an axial captive force upon the assembled components. The sleeve 166 is selected from a supply of different sleeves, including one other sleeve 166' shown, that is shorter in length, for its length, that will be matched with that of the filter housing.

As noted previously, the precise configuration and composition of the various components is not limited to those shown in the embodiments shown. As just one example, the coupler 16 may be made from a sheet material that is conductive or non-conductive. A conductive material is preferred.

Figure 10:
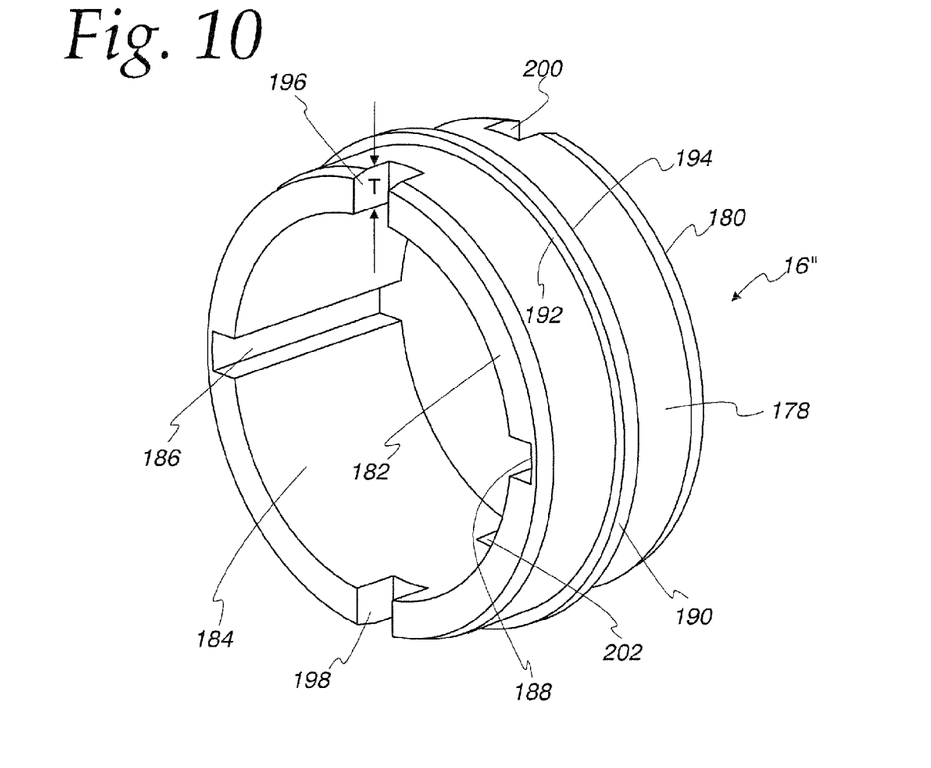
FIG. 10 is a view as in FIGS. 6 and 9 of a further modified form of coupler.

As another alternative, a coupler 16" is shown in FIG. 10 that lends itself to being machined from a solid material, cast, or sintered. In this embodiment, the coupler 16" has a body 178 with a nominally uniform thickness T between axial ends 180, 182. The inside surface 184 is machined to define diametrically opposite slots 186, 188, bounded by guide edges, continuously between the ends 180, 182.

Figure 11:
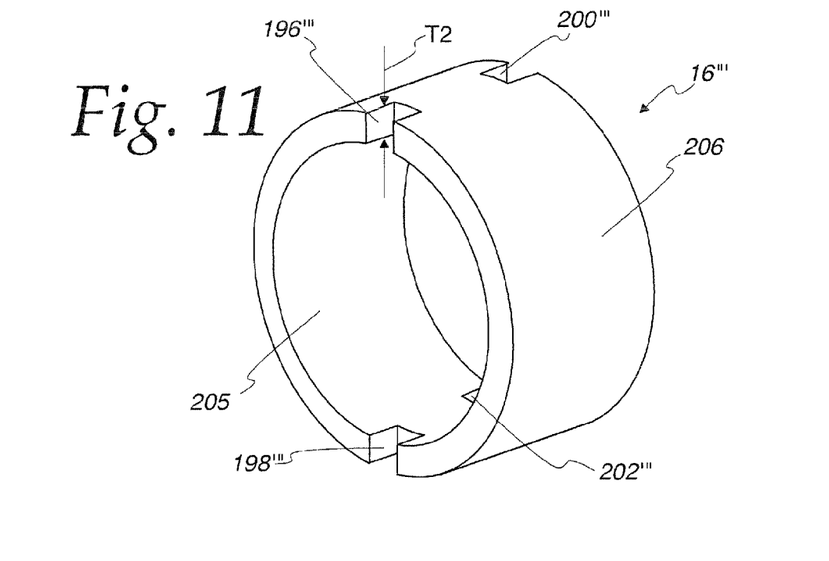
FIG. 11 is a view as in FIGS. 6, 9 and 10 of a still further modified form of coupler.

As a still further variation, a coupler 16''' may be used, as seen in FIG. 11. The coupler 16''' is similar to the coupler 16" in FIG. 10, with the exception that there is no bead corresponding to the bead 190. Instead, the coupler 16''' may rely upon the fingers 122, 128 to abut the bases of the notches 196''', 198'''; 200''', 202''' to consistently establish the relative axial positions of the joined components 12, 14, 16'''. Alternatively, the ends 26, 30 of the filter housing sections 12, 14 may abut as in FIG. 5 to fix this relationship.

By eliminating the slots 186, 188 as shown on the coupler 16", the coupler 16''' can be made more simply and inexpensively. The radial thickness T2 of an annular wall 206 on the coupler 16''', and the diameter of the inside surface 208 thereon, are selected so that the printed circuit board can pass axially therethrough without interference. Thus, the angular keying of the coupler 16''' to the filter housing sections 12, 14 is required only to maintain an angular relationship between those sections 12, 14 to provide the aligned arrangement for the slot/receptacle for the printed circuit board 76 on axially opposite sides of the coupler 16'''.

A radially enlarged annular bead 190 defines axially oppositely facing stop surfaces 192, 194 for the axial ends of connected housing sections. Diametrically opposite keying elements/notch pairs 196, 198; 200, 202 are provided to cooperate with the aforementioned fingers 122, 128.

Many other variations from the preferred embodiment are contemplated. For example, at each telescoping connection, the arrangement of inner and outer overlapping sections may be reversed on their respective components.

Similarly, whereas the keying components/notches 124, 126, 130, 132 are shown on the coupler 16, to cooperate with the keying components/fingers 122, 128, 144, 158, corresponding keying components/fingers might be provided on the coupler 16, with the complementary keying components/notches provided on the filter housing sections 12, 14.

The foregoing disclosure of specific embodiments is intended to be illustrative of the broad concepts comprehended by the invention.

The invention claimed is:

1. A kit comprising:
 a first group of components comprising:
  a first filter housing section extending around a first space with a first central axis and having axially spaced first and second ends;
  a second filter housing section extending around a second space with a second central axis and having axially spaced first and second ends;
  a first coupler defining an opening;
  a first cable end fitting; and
  a second cable end fitting,
 the first group of components configured to selectively combine to define a plurality of different filter housings having different axial lengths, the different filter housings including:
  i) the first filter housing section having the first cable end fitting connected to the first end of the first filter housing section, and the second cable end fitting connected to the second end of the first filter housing section, the first space configured to receive a first circuit board having a first length; and
  ii) the first end of the first filter housing section and the first end of the second filter housing section connected to the first coupler to define a combined space configured to receive a second circuit board between the second ends of the first and second housing sections, the second circuit board being longer than the first circuit board, the combined space configured to receive the second circuit board, and to enable the second circuit board to extend into and continuously between the first and second spaces through the opening defined by the first coupler, the first cable end fitting being connected to the second end of the first filter housing section, and the second cable end fitting being connected to the second end of the second filter housing section.

2. The kit according to claim 1 wherein the first coupler has an edge configured to individually cooperate with the first and second circuit boards and to individually maintain the first and second circuit boards in a predetermined orientation in the combined space with the first group of components in a first combined configuration.

3. The kit according to claim 1 wherein the first filter housing section has at least one edge configured to individually cooperate with the first and second circuit boards to individually maintain the first and second circuit boards in a predetermined orientation in the combined space with the first group of components in a first combined configuration.

4. The kit according to claim 3 wherein the at least one edge comprises first and second pairs of edges between which separate slots are formed at diametrically opposite locations on the first filter housing section.

5. The kit according to claim 1 wherein the first ends of the first and second filter housing sections are each telescopingly engaged with the first coupler with the first group of components in a first combined configuration.

6. The kit according to claim 5 wherein the first end of the first filter housing section comprises a first keying component and the first coupler comprises a second keying component such that, when the first end of the first filter housing section is connected to the first coupler, the first keying component and the second keying component limit relative angular movement between the first filter housing section and first coupler.

7. The kit according to claim 6 wherein the first coupler comprises a cylindrical wall and the first keying component is struck from the cylindrical wall on the first filter housing section.

8. The kit according to claim 1 wherein the first cable end fitting and first coupler are each configured to telescopingly engage with each of the second end of the first filter housing section and the first end of the second filter section housing.

9. The kit according to claim 1 wherein the first cable end fitting comprises a first keying component and first filter housing section comprises a second keying component, the first keying component and the second keying component are configured to interact to key the first cable end fitting and the first filter housing section so as to limit relative angular movement therebetween with the first filter housing section and the first cable end fitting in at least first and second different relative angular positions.

10. The kit according to claim 1 further in combination with first and second sleeves with different axial lengths that are configured to selectively closely respectively surround the first group of components in a first configuration and in a second combined configuration.

11. The kit according to claim 1 wherein the first group of components further comprises a third filter housing section extending around a third space with a third central axis and having axially spaced first and second ends, and a second coupler, the first group of components and third filter housing section and second coupler, the first group of components further configured to selectively combine to define a filter housing with a further combined configuration with the first and second filter housing sections and first coupler in a first combined configuration and the second coupler connected to the second end of the first filter housing section and the first end of the third filter housing section and the first cable end fitting connected to the second end of the third filter housing section.

12. The kit according to claim 1 wherein the first and second filter housing sections and the first and second cable end fittings are all separate components in a set that are each aligned with and configured to axially move relative to at least one adjacent component in the set to operatively connect the components in the set.

13. The kit according to claim 1 wherein the first group of components is configured to combine to define a filter housing with a second combined configuration with the second filter housing section having the first cable end fitting connected to the first end of the second filter housing section, and the second cable end fitting connected to the second end of the second filter housing section, the second space configured to receive a third circuit board having a length different from the first and second circuit boards.

14. A kit comprising:
a first group of components comprising:
a first filter housing section extending around a first space with a first central axis and having axially spaced first and second ends;
a second filter housing section extending around a second space with a second central axis and having axially spaced first and second ends;
a first coupler;
a first cable end fitting; and
a second cable end fitting,
the first group of components configured to selectively combine to define filter housings having different axial lengths including a first combined configuration with the first end of the first filter housing section and the first end of the second filter housing section connected to the first coupler to define a combined space for a circuit board between the second ends of the first and second housing sections, the first and second housing sections configured to operatively support the circuit board extending into and continuously between the first and second spaces and through the first coupler,
wherein the first cable end fitting is connected to the second end of the first filter housing section, and the second cable end fitting is connected to the second end of the second filter housing section,
wherein the first filter housing section has a slot configured to cooperate with the circuit board and to maintain the circuit board in a predetermined orientation in the combined space with the first group of components in the first combined configuration, and
wherein the slot is configured to enable an edge of the circuit board within the combined space to be axially guided.

15. The kit according to claim 14 wherein the first filter housing section comprises a first keying component and the first coupler comprises a second keying component, the first keying component and the second keying component configured to cooperate and to limit relative angular movement between the first filter housing section and the first coupler.

16. The kit according to claim 14 wherein the second filter housing section comprises at least one second filter housing section slot configured to cooperate with the circuit board to maintain the circuit board in the predetermined orientation in the combined space.

17. The kit according to claim 16 wherein the at least one second filter housing section slot comprises first and second pairs of edges between which separate slots are formed at diametrically opposite locations on the second filter housing section.

18. A housing kit for a filter, the housing kit comprising:
a plurality of connectable components comprising:
a first cable end fitting;
a second cable end fitting;
a housing connector defining an opening;
a first housing section, the first housing section defining a first space, the first housing section configured to connect with each of: the housing connector, the first cable end fitting and the second cable end fitting; and
a second housing section, the second housing section defining a second space the second housing section configured to connect with each of: the housing connector, the first cable end fitting and the second cable end fitting,
wherein the plurality of connectable components are configured to be selectively combined to define any one of at least: a first configuration and a second configuration, wherein the first configuration comprises the first cable end fitting connected to the first housing section, the first housing section connected to the second cable end fitting, the first configuration defining a first space configured to receive a first circuit board that has a first length enabling the first circuit board to be housed by the first housing section; and wherein the second configuration comprises the first cable end fitting connected to the first housing section, the first housing section connected to the housing connector, the housing connector connected to the second housing section and the second housing section connected to the second cable end fitting, the second configuration defining a combined space comprising the first space and the second space, the combined space configured to receive a second circuit board that has a second length that is greater than the first length, the opening of the housing connector configured to enable the second circuit board to extend through the opening while being housed by the first and second housing sections.

19. The housing kit according to claim 18 wherein the plurality of connectable components are configured to be selectively combined to define a third configuration, the third configuration comprising the second cable end fitting connected to the first housing section, the first housing section connected to the housing connector, the housing connector connected to the second housing section and the second housing section connected to the first cable end fitting, the third configuration defining a second combined space comprising the first space and the second space, the second combined space having a third length that is equal to the second length.

20. The housing kit according to claim 18 wherein the first housing section comprises a first keying component and the housing connector comprises a second keying component, the first keying component and the second keying component are configured to interact to key the first housing section and the housing connector so as to maintain the first housing section and the housing connector in a predetermined angular orientation.

21. The housing kit according to claim 18 wherein the first housing section comprises a slot configured to maintain the second circuit board in a predetermined orientation in the combined space with the plurality of connectable components being in the second configuration.

22. The housing kit according to claim 21 wherein the slot is configured to enable an edge of the second circuit board to be axially guided into the combined space.

23. The housing kit according to claim 18 wherein the first housing section comprises a slot, the slot is configured: to enable an edge of the first circuit board to be axially guided into the first space when the first housing section is in the first configuration, and to enable an edge of the second circuit board to be axially guided into the combined space when the first housing section is in the second configuration.

24. A method of forming an electrical filter, the method comprising the steps of:
providing:
  a) multiple filter housing sections, each extending around a space with a central axis and having an axial length between first and second ends to which cable end fittings are configured to be respectively connected;
  b) at least one coupler defining an opening configured to individually receive a plurality of circuit boards of different lengths at different occasions;
  c) a first cable end fitting; and
  d) a second cable end fitting,
selecting a circuit board of the plurality of circuit boards with a length to be incorporated into the electrical filter;
based upon the length of the circuit board, selecting at least two filter housing sections of the multiple filter housing sections such that the at least two filter housing sections have a combined axial length that is matched to the length of the circuit board;
connecting the at least two filter housing sections and the at least one coupler to define a combined housing configuration with spaced axial ends and a combined space;
axially guiding the circuit board into the combined housing configuration and through the opening of the at least one coupler; and
connecting the first and second cable end fittings, one each at one of the spaced axial ends of the combined housing configuration, and to the circuit board supported by the at least two filter housing sections to establish an electrical path between the first and second cable end fittings.

25. The method of forming an electrical filter according to claim 24 wherein the step of connecting multiple filter housing sections together comprises press-fitting the at least two filter housing sections and the at least one coupler together by relative axial movement therebetween to establish a keyed connection wherein first and second filter housing sections in the at least two filter housing sections are each limited in angular movement relative to the at least one coupler to which the first and second filter housing sections are connected.

* * * * *